US011955514B2

United States Patent
Mun et al.

(10) Patent No.: US 11,955,514 B2
(45) Date of Patent: Apr. 9, 2024

(54) FIELD-EFFECT TRANSISTORS WITH A GATE STRUCTURE IN A DUAL-DEPTH TRENCH ISOLATION STRUCTURE

(71) Applicant: GLOBALFOUNDRIES Singapore Pte. Ltd., Singapore (SG)

(72) Inventors: Bong Woong Mun, Singapore (SG); Jeoung Mo Koo, Singapore (SG)

(73) Assignee: GlobalFoundries U.S. Inc., Malta, NY (US)

( * ) Notice: Subject to any disclaimer, the term of this patent is extended or adjusted under 35 U.S.C. 154(b) by 226 days.

(21) Appl. No.: 17/335,093

(22) Filed: Jun. 1, 2021

(65) Prior Publication Data
US 2022/0384571 A1 Dec. 1, 2022

(51) Int. Cl.
H01L 29/06 (2006.01)
H01L 29/66 (2006.01)
H01L 29/78 (2006.01)

(52) U.S. Cl.
CPC .... H01L 29/0653 (2013.01); H01L 29/66681 (2013.01); H01L 29/7816 (2013.01)

(58) Field of Classification Search
CPC .......... H01L 29/0653; H01L 29/66681; H01L 29/7816; H01L 29/0886; H01L 29/4236; H01L 29/66704
See application file for complete search history.

(56) References Cited

U.S. PATENT DOCUMENTS

| 8,357,986 | B2 | 1/2013 | Wang et al. |
| 8,709,899 | B2 | 4/2014 | Zuniga et al. |
| 2014/0021534 | A1* | 1/2014 | Verma ............... H01L 21/82385 438/270 |
| 2016/0099325 | A1* | 4/2016 | Calafut ............. H01L 29/42368 257/331 |

OTHER PUBLICATIONS

Saumitra Mehrotra et al., Towards ultimate scaling of LDMOS with Ultralow Specific On-resistance, 2020 32nd International Symposium on Power Semiconductor Devices and ICs (ISPSD), 2020, IEEE.

* cited by examiner

*Primary Examiner* — Mohammed R Alam
(74) *Attorney, Agent, or Firm* — David Cain

(57) ABSTRACT

The embodiments herein relate to field-effect transistors (FETs) with a gate structure in a dual-depth trench isolation structure and methods of forming the same. The FET includes a substrate having an upper surface, a trench isolation structure, and a gate structure adjacent to the trench isolation structure. The trench isolation structure has a first portion having a lower surface and a second portion having a lower surface in the substrate; the lower surface of the first portion is above the lower surface of the second portion.

18 Claims, 4 Drawing Sheets

FIELD-EFFECT TRANSISTORS WITH A GATE STRUCTURE IN A DUAL-DEPTH TRENCH ISOLATION STRUCTURE

TECHNICAL FIELD

The present disclosure relates generally to semiconductor devices, and more particularly to field-effect transistors (FETs) with a gate structure in a dual-depth trench isolation structure and methods of forming the same.

BACKGROUND

Semiconductor devices play many roles in modern society, including a crucial role in the conditioning and distribution of power and energy in the world. Field-effect transistors (FETs), such as laterally-diffused field-effect (LDMOS) transistors and extended-drain field-effect transistors (EDMOS), are capable to handle a wide range of power levels. These FETs can be found in systems delivering as little as a few tens of milliwatts for a headphone amplifier, up to around a gigawatt in a high-voltage direct current transmission line.

With technological advances in the semiconductor industry driving a need for continuous improvements to semiconductor devices, FETs having improved device performance are provided.

SUMMARY

To achieve the foregoing and other aspects of the present disclosure, field-effect transistors with a gate structure in a dual-depth trench isolation structure and methods of forming the same are presented.

According to an aspect of the present disclosure, a device is provided. The device includes a substrate having an upper surface, a trench isolation structure, and a gate structure in the substrate adjacent to the trench isolation structure. The trench isolation structure has a first portion having a lower surface and a second portion having a lower surface in the substrate; the lower surface of the first portion is above the lower surface of the second portion.

According to another aspect of the present disclosure, a device is provided. The device includes a substrate having an upper surface, a trench isolation structure, and a gate structure. The trench isolation structure has a first portion and a second portion in the substrate. The first portion of the trench isolation structure has a first upper surface, a first lower surface, and a side surface, and the second portion of the trench isolation structure has a second upper surface that is substantially coplanar with the first upper surface and a second lower surface that is below the first lower surface of the first portion. The gate structure is in the substrate adjacent to the first portion of the trench isolation structure, and the gate structure has a side surface that is substantially coplanar with the side surface of the first portion of the trench isolation structure.

According to yet another aspect of the present disclosure, a method of forming a device is provided. The method includes forming a trench isolation structure in a substrate and forming a gate structure in the substrate adjacent to the trench isolation structure. The trench isolation structure has a first portion and a second portion, and the first portion has a lower surface above a lower surface of the second portion.

BRIEF DESCRIPTION OF THE DRAWINGS

The embodiments of the present disclosure will be better understood from a reading of the following detailed description, taken in conjunction with the accompanying drawings.

Figure 1A:
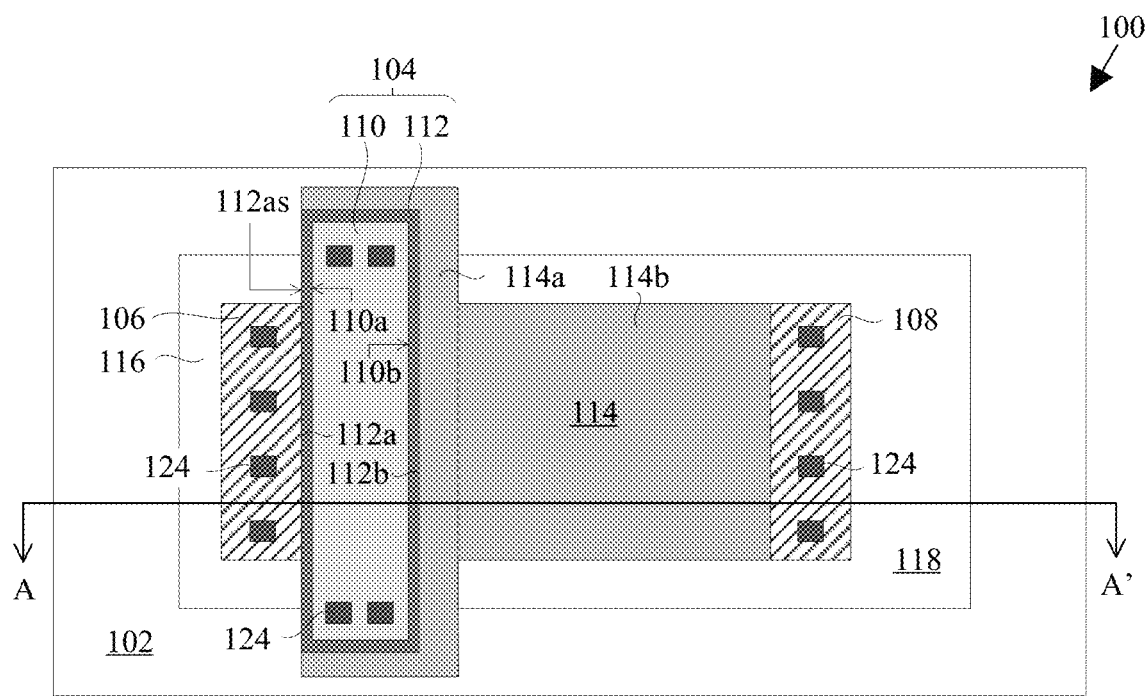
FIG. 1A is a plan view of a semiconductor device, according to an embodiment of the disclosure.

For simplicity and clarity of illustration, the drawings illustrate the general manner of construction, and certain descriptions and details of features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to semiconductor devices, and more particularly to field-effect transistors (FETs) having a gate structure in a dual-depth trench isolation structure and methods of forming the same. FETs that are designed to handle significant power levels preferably have a high figure of merit for superior device performance. For example, a desired FET may have low drain-source on-resistance ($R_{ds(on)}$) and low gate charge ($Q_g$).

Asymmetrical FETs are FETs having a drain extension region between a drain region and a gate electrode, and the drain extension region advantageously improves the breakdown voltage of the FETs by reducing the surface electric field around the drain region. Examples of asymmetrical FETs may include a laterally-diffused metal-oxide-semiconductor (LDMOS) FET and an extended-drain metal-oxide-semiconductor (EDMOS) FET.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Figure 1B:
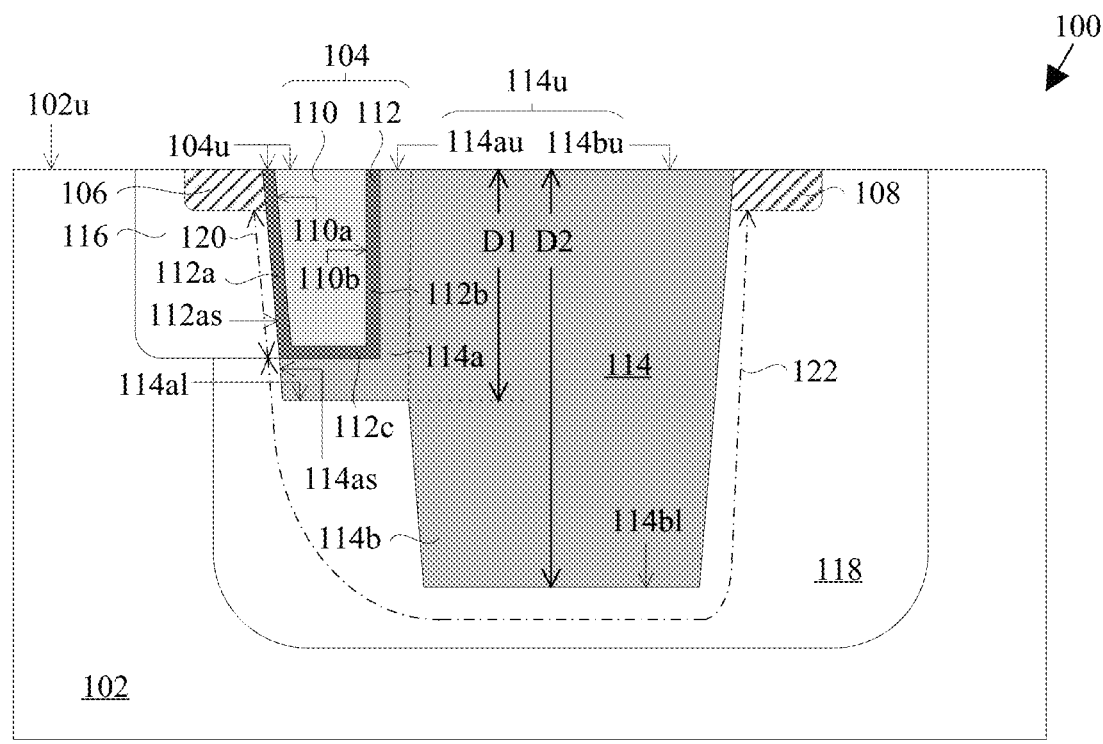
FIG. 1B is a cross-sectional view of the semiconductor device in FIG. 1A, taken along a line A-A', according to an embodiment of the disclosure.

FIG. 1A is a plan view of a FET 100 and FIG. 1B is a cross-sectional view of the FET 100 of FIG. 1A, taken along a line A-A', according to an embodiment of the disclosure. The FET 100 may be part of a semiconductor device and may reside in a device region of the semiconductor device. The device region may include a plurality of FETs and only one FET is illustrated for clarity purposes.

The FET 100 may be positioned within a substrate 102. The substrate 102 may have an upper surface 102u. The substrate 102 may include a semiconductor material, such as silicon, silicon germanium, silicon carbide, other II-VI or III-V semiconductor compounds, and the like. Furthermore, the substrate 102 may be in a form of a bulk semiconductor substrate or a layered semiconductor substrate, such as a semiconductor-on-insulator (SOI) substrate. In an embodiment of the disclosure, substrate 102 may have P-type conductivity.

The FET 100 may include a plurality of features such as, but not limited to, a gate structure 104, a source region 106, and a drain region 108. The gate structure 104 may be laterally positioned between the source region 106 and the drain region 108 in the substrate 102. The gate structure 104 may have an upper surface 104u that is substantially coplanar with the upper surface 102u of the substrate 102. In an embodiment of the disclosure, the FET 100 may include an asymmetrical FET, where the gate structure 104 may be positioned nearer to the source region 106 than to the drain region 108.

The gate structure 104 may include a gate electrode 110 and a dielectric layer 112. The dielectric layer 112 may be positioned adjacent to, or adjoins, the gate electrode 110. The dielectric layer 112 may include at least a peripheral dielectric portion 112a over a side surface 110a of the gate electrode 110; the side surface 110a being proximal to the source region 106. The dielectric layer 112 may further include a peripheral dielectric portion 112b over a side surface 110b of the gate electrode 110; the side surface 110b being laterally opposite the side surface 110a such that the side surface 110b may be closer to the drain region 108 than the side surface 110a. The dielectric layer 112 may yet further include a central dielectric portion 112c that underlies the gate electrode 110, as illustrated in FIG. 1B. In an embodiment of the disclosure, the dielectric layer 112 may surround the gate electrode 110 and acquire a "U-shaped" profile.

The peripheral dielectric portion 112a may serve as a gate dielectric layer for the FET 100. The peripheral dielectric portion 112a may be substantially vertical, extending downwardly below from the upper surface 102u of the substrate 102. In this embodiment, the FET 100 may be referred to as a vertical FET device. A vertical FET device may have improved figure-of-merit over a lateral FET device. For example, a vertical FET may have reduced cell or device pitch and/or increased linear current.

The FET 100 may further include a trench isolation (STI) structure 114 laterally positioned between the source region 106 and drain region 108. The trench isolation structure 114 may have an upper surface 114u. The trench isolation structure 114 may extend downwardly below from the upper surface 102u of the substrate 102. In an embodiment of the disclosure, the upper surface 114u of the trench isolation structure 114 may be substantially coplanar with the upper surface 102u of the substrate 102. In an embodiment of the disclosure, the trench isolation structure 114 may be a shallow trench isolation (STI) structure of the FET 100.

The trench isolation structure 114 may include a trench isolation portion 114a and a trench isolation portion 114b; an arbitrary interface between the trench isolation portion 114a and the trench isolation portion 114b is demarcated by a dashed line. The trench isolation portion 114a may be positioned proximal to the source region 106 and the trench isolation portion 114b may be positioned proximal to the drain region 108. In an embodiment of the disclosure, the trench isolation portion 114a may have a width narrower than a width of the trench isolation portion 114b. As used herein, the term "width" is a dimension of a feature that laterally extends between the source region 106 and drain region 108. It may be advantageous that the trench isolation portion 114b be wider than the trench isolation portion 114a as the increased width of the trench isolation portion 114b may result in lower parasitic Miller capacitance during operation of the FET 100.

As further illustrated in FIG. 1B, the trench isolation structure 114 may be a dual-depth trench isolation structure, i.e., the trench isolation portion 114a may have a trench isolation depth D1 relative to the upper surface 102u of the substrate 102, and the trench isolation portion 114b may have a trench isolation depth D2 relative to the upper surface 102u of the substrate 102; the depth D1 being shallower than the depth D2. Accordingly, the trench isolation portion 114a has an upper surface 114au and a lower surface 114a1, and the trench isolation portion 114b has an upper surface 114bu and a lower surface 114b1. The upper surface 114au of the trench isolation portion 114a and the upper surface 114bu of the trench isolation portion 114b may be substantially coplanar with the upper surface 102u of the substrate 102. The lower surface 114b1 of the trench isolation portion 114b may be below the lower surface 114a1 of the trench isolation portion 114a. In an embodiment of the disclosure, the depth D1 of the trench isolation portion 114a may be at most half that of the depth D2 of the trench isolation portion 114b. In another embodiment of the disclosure, the trench isolation portion 114a may have a depth in a range of 50 nm to 200 nm. In yet another embodiment of the disclosure, the trench isolation portion 114b may have a depth of about 400 nm.

As mentioned above, the gate structure 104 may be positioned in the substrate 102; more specifically, the gate electrode 110 and the dielectric layer 112 may be positioned at least adjacent to the trench isolation structure 114. For example, the gate structure 104 may be positioned adjacent the trench isolation portion 114a such that a first section of the trench isolation portion 114a may underlie the gate structure 104, i.e., the first section of the trench isolation portion 114a may be positioned between the gate structure 104 and the lower surface 114a1 of the trench isolation portion 114a of the trench isolation structure 114. The gate structure 104 may extend from the upper surface 102u of the substrate 102 to the first section of the trench isolation portion 114a of the trench isolation structure 114 such that the central dielectric portion 112c of the dielectric layer 112 is in contact with the first section of the trench isolation portion 114a. In an embodiment of the disclosure, the first section of the trench isolation portion 114a underlying the gate structure 104 may have a thickness of at most 20 nm. In another embodiment of the disclosure, the peripheral dielectric portion 112a may have a side surface 112as, and the trench isolation portion 114a may have a side surface 114as that is substantially coplanar with the side surface 112as of the peripheral dielectric portion 112a.

In yet another example, the gate structure 104 may be further positioned adjacent to the trench isolation portion 114a such that a second section of the trench isolation portion 114a may be positioned between the gate structure 104 and the trench isolation portion 114b.

The FET 100 may further include a plurality of doped wells, such as a doped well 116 and a doped well 118. The doped well 116 may be positioned adjacent to, or adjoins, the peripheral dielectric portion 112a. The doped well 116 may serve as a body well for the FET 100. The source region 106 may be positioned in the doped well 116.

The source region 106 may be further positioned adjacent to, or adjoins, the peripheral dielectric portion 112a. A channel region 120 may be formed in the doped well 116 at a region where the doped well 116 adjoins the peripheral dielectric portion 112a. The channel region 120 may be substantially vertical and substantially parallel to the peripheral dielectric portion 112a, as illustrated in FIG. 1B. In an embodiment of the disclosure, the doped well 116 and the source region 106 may have opposite conductivities. For example, the source region 106 may have N-type conductivity and the doped well 116 may have P-type conductivity.

The doped well 118 may be positioned adjacent to, or adjoins, the trench isolation structure 114. The drain region 108 may be positioned in the doped well 118. The drain region 108 may be positioned adjacent to, or adjoins, the trench isolation portion 114a. The doped well 118 may serve as a drift well for the FET 100. In an embodiment of the disclosure, the drain region 108 and the doped well 118 may have the same conductivity, for example, N-type conductivity.

The doped well 118 may provide an electrical pathway 122 for the diffusion of electrical charges between the channel region 120 and the drain region 108. For example, electrical charges may travel along the electrical pathway 122 when a potential difference is being applied to the doped region 106 and the doped region 108. The doped well 118 may be further positioned against to, or adjoins, the peripheral dielectric portion 112a.

The source region 106, the drain region 108, the doped well 116, and the doped well 118 may extend downwardly below from the upper surface 102u of the substrate 102. In an embodiment of the disclosure, the source region 106, the drain region 108, the doped well 116, and doped well 118 may have substantially coplanar upper surfaces. In another embodiment of the disclosure, the depth of the doped well 116 may be shallower than the depth of the doped well 118, relative to the upper surface 102u of the substrate 102.

The dopant concentrations and/or dopant depths of the source region 106 and drain region 108, as well as the doped well 116 and the doped well 118, may vary depending on the technology node and design requirements for the FET 100. It is understood that the source region 106 and the drain region 108, may not necessarily have the same form, even though FIGS. 1A and 1B illustrate them as such.

The FET 100 may yet further include contact structures 124, as illustrated in FIG. 1A. The contact structures 124 may be positioned over the gate electrode 110, the source region 106, and the drain region 108 to provide electrical coupling between the various features of the FET 100, as well as electrically coupling the FET 100 to other field-effect transistors in the device region or other regions of the semiconductor device.

FIGS. 2A to 2F are cross-sectional views that illustrate a method of forming the FET 100 in FIG. 1B, according to an embodiment of the disclosure. Certain structures may be fabricated, for example, using known processes and techniques, and specifically disclosed processes and methods may be used to achieve individual aspects of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" include deposition of material or photoresist, patterning, exposure, development, etching, cleaning, and/or removal of the material or photoresist as required in forming a described pattern, structure, or opening. Exemplary examples of techniques for patterning include, but not limited to, wet etch photolithographic processes, dry etch photolithographic processes, or direct patterning processes. Such techniques may use mask sets and mask layers with dopants having a desired conductivity type.

Figure 2A:
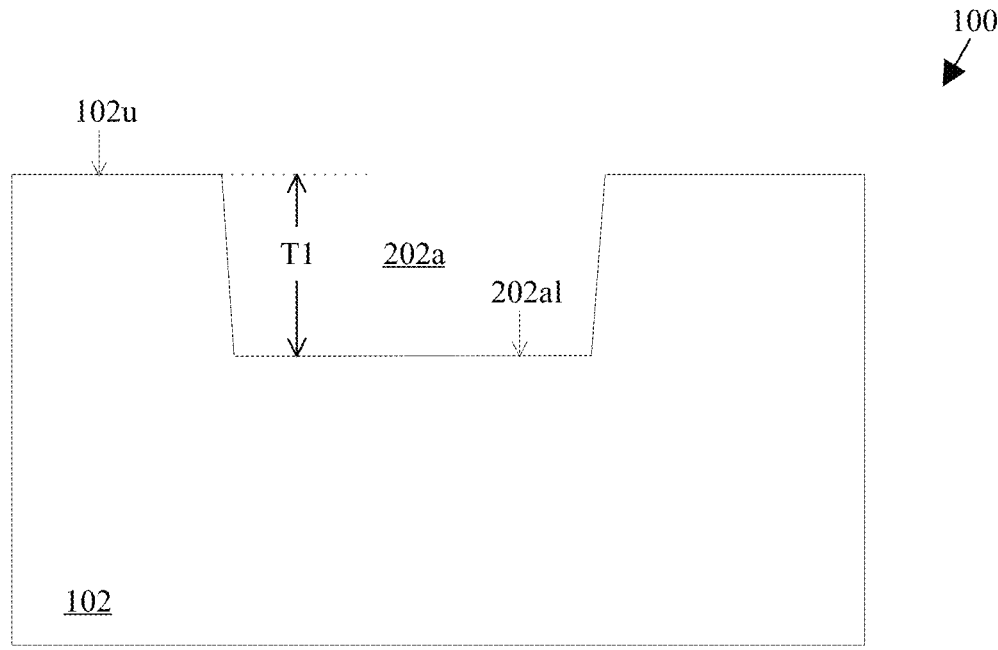
FIGS. 2A to 2F are cross-sectional views that illustrate a method of forming the semiconductor device in FIG. 1, according to an embodiment of the disclosure.

As illustrated in FIG. 2A, a substrate 102 may be provided; the substrate 102 having an upper surface 102u. A trench 202a may be formed in the substrate 102 using a patterning technique. The trench 202a may extend downwardly below from the upper surface 102u of the substrate 102. The trench 202a may have a lower trench surface 202a1 formed in the substrate 102, effectuating a trench depth T1 relative to the upper surface 102u of the substrate 102.

Figure 2B:
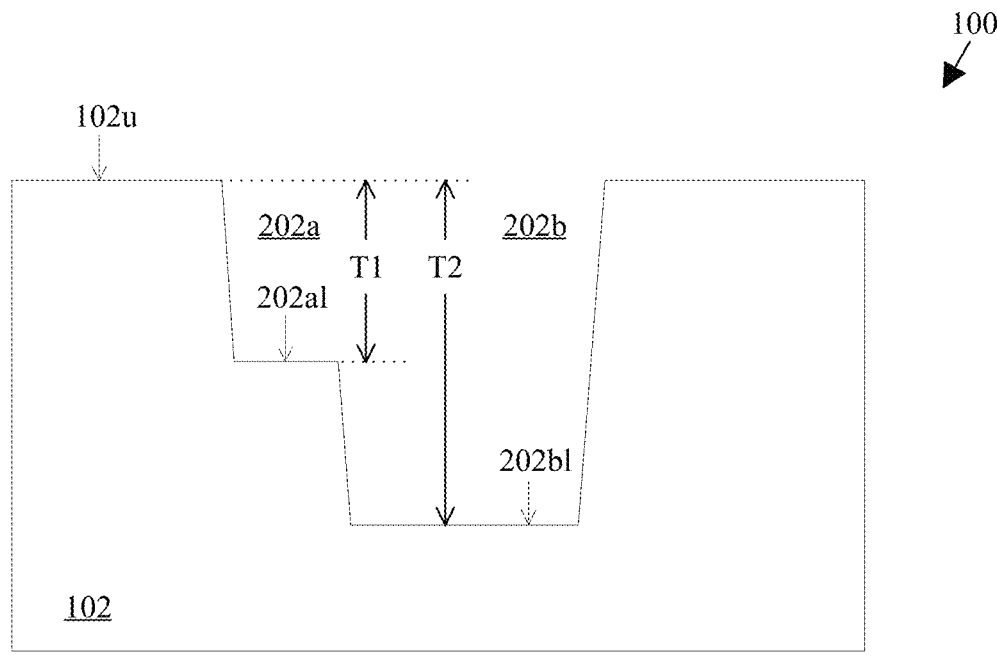

FIG. 2B illustrates the FET 100 after forming a trench 202b in the substrate 102, according to an embodiment of the disclosure. The trench 202b may be formed within the trench 202a using a patterning technique. The trench 202b may have a lower trench surface 202b1 formed in the substrate 102, effectuating a trench depth T2 relative to the upper surface 102u of the substrate 102; the trench depth T2 having a greater depth than the trench depth T1. Accordingly, the lower trench surface 202b1 may be below the lower trench surface 202a1.

Although FIGS. 2A to 2B illustrates a method of forming trenches 202a, 202b, other methods may be employed to form the trenches 202a, 202b. For example, the shallower trench 202a may be formed adjacent to and integrate with the deeper trench 202b. In another example, the trench 202b may not be formed through the trench 202a, but may be formed adjacent to and integrate with the trench 202a.

Figure 2C:
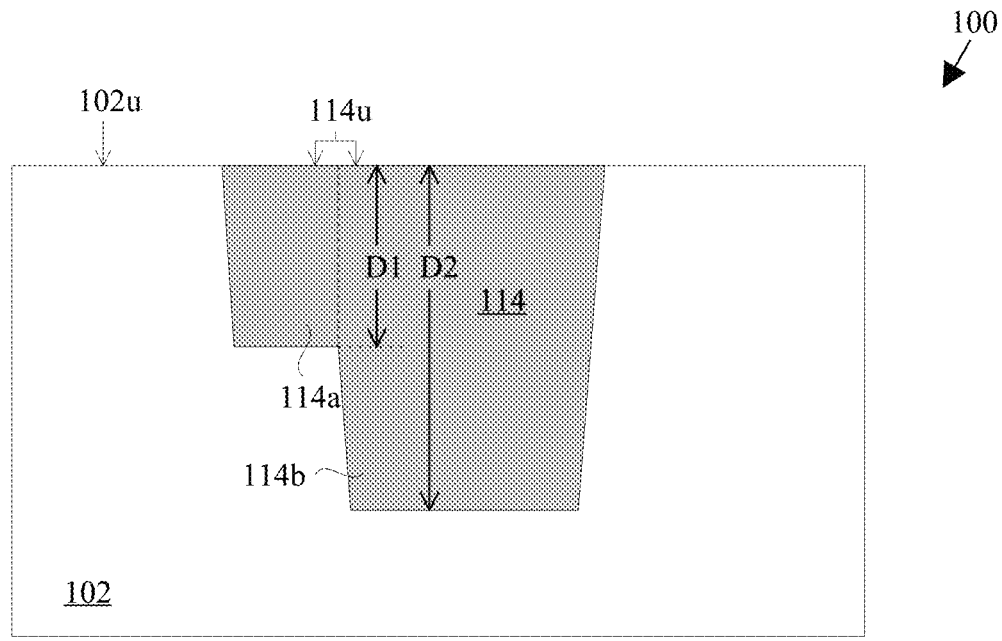

FIG. 2C illustrates the FET 100 after forming a trench isolation structure 114, according to an embodiment of the disclosure. The trench isolation structure 114 may be formed using a deposition technique to deposit a dielectric material to fill the trenches 202a, 202b to a level substantially coplanar with the upper surface 102u of the substrate 102. A planarization technique, such as a chemical-mechanical planarization (CMP) process, may be employed to effectuate a substantially planar topography over the FET 100, i.e., the trench isolation structure 114 having an upper surface 114u that is substantially coplanar with the upper surface 102u of the substrate 102. In an embodiment of the disclosure, the dielectric material may include, but not limited to, silicon dioxide or silicon nitride.

The trench isolation structure 114 may include a trench isolation portion 114a formed in the trench 202a and a trench isolation portion 114b formed in the trench 202b; an arbitrary interface between the trench isolation portions 114a, 114b is demarcated by a dashed line. Accordingly, the trench isolation portions 114a, 114b may have a trench isolation depth D1 and a trench isolation depth D2, respectively, relative to the upper surface 102u of the substrate 102. In an embodiment of the disclosure, the trench isolation depths D1, D2 may be equal to the trench depths T1, T2.

Figure 2D:
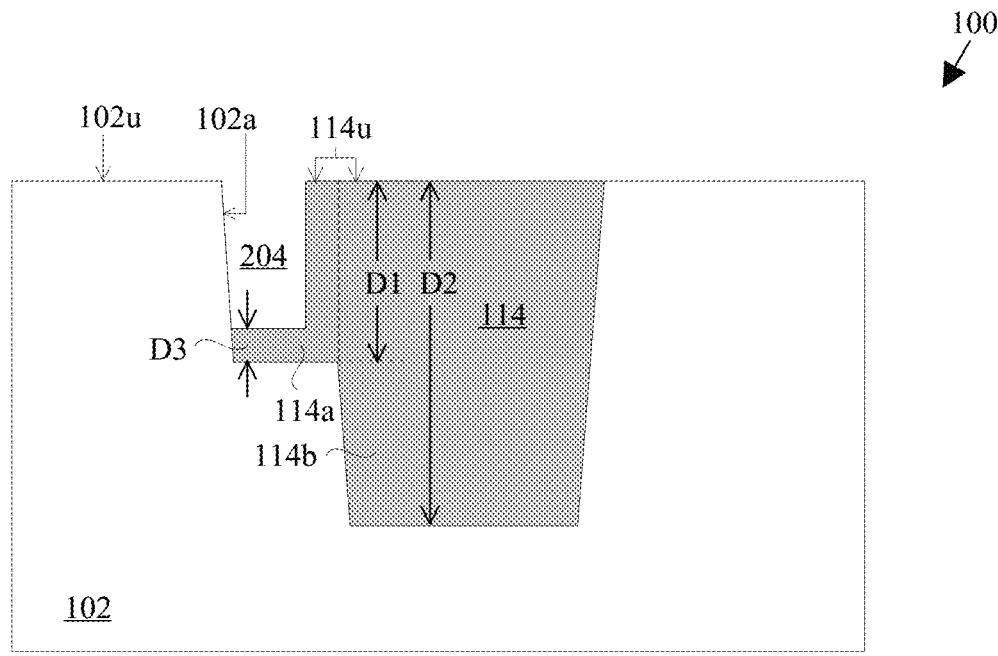

FIG. 2D illustrates the FET 100 after forming a gate trench 204 in the trench isolation structure 114, according to an embodiment of the disclosure. The gate trench 204 may be formed in the trench isolation structure using a patterning technique, such that the gate trench may be positioned adjacent to the trench isolation portion 114a. A substrate surface 102a may be exposed in the gate trench 204. The trench isolation portion 114a may include a first section underlying the gate trench 204 and the first section may have a thickness D3. In an embodiment of the disclosure, the thickness D3 may be at most 20 nm. A second section of the trench isolation portion 114a may be positioned between the gate trench 204 and the trench isolation portion 114b.

Figure 2E:
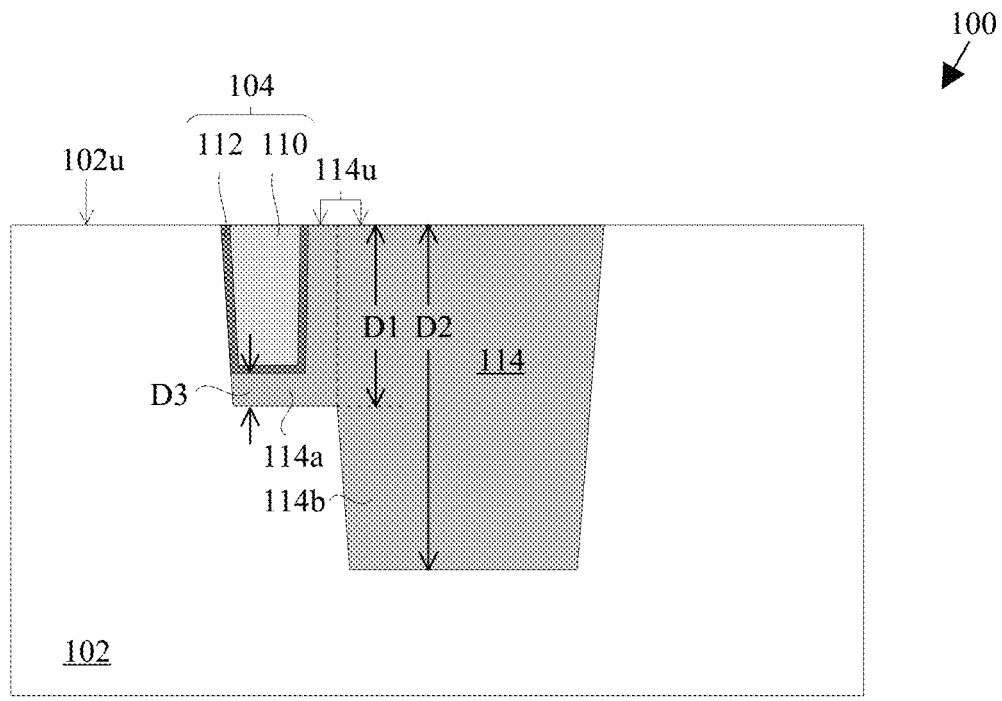

FIG. 2E illustrates the FET 100 after forming a gate electrode 110 and a dielectric layer 112 in the gate trench 204, according to an embodiment of the disclosure. The FET 100 may be subjected to a suitable cleaning process prior to forming the gate electrode 110 and the dielectric layer 112. The cleaning process may remove any undesirable contaminants, such as native oxide material formed as a result of natural oxidation of the exposed substrate surface 102a, in the gate trench 204.

The gate electrode 110 and the dielectric layer 112 may be formed vertically in the gate trench 204. An exemplary process to form the gate electrode 110 and the dielectric layer 112 is described herein. A dielectric material may be lined over the substrate 102 and in the gate trench 204 using a deposition technique. The dielectric material may overlay sidewalls, such as the substrate surface 102a, and a lower surface of the gate trench 204. In an embodiment of the disclosure, the dielectric material may be deposited using a conformal deposition technique, for example, an ALD process or a conformal CVD process. In another embodiment of the disclosure, the dielectric material may include a material suitable as a gate dielectric layer, for example, silicon dioxide.

A conductive material may be subsequently deposited over the dielectric material to at least fill the gate trench 204 to a level substantially coplanar with the upper surface 102u of the substrate 102. In an embodiment of the disclosure, the conductive material may include a material suitable as a gate electrode, for example, polysilicon.

A planarization technique, such as a CMP process, may be performed to remove portions of the conductive material and the dielectric material over the upper surface 102u of the substrate 102 to form the gate electrode 110 and the dielectric layer 112, respectively. The gate electrode 110 and the dielectric layer 112 form a gate structure 104 for the FET 100.

Figure 2F:
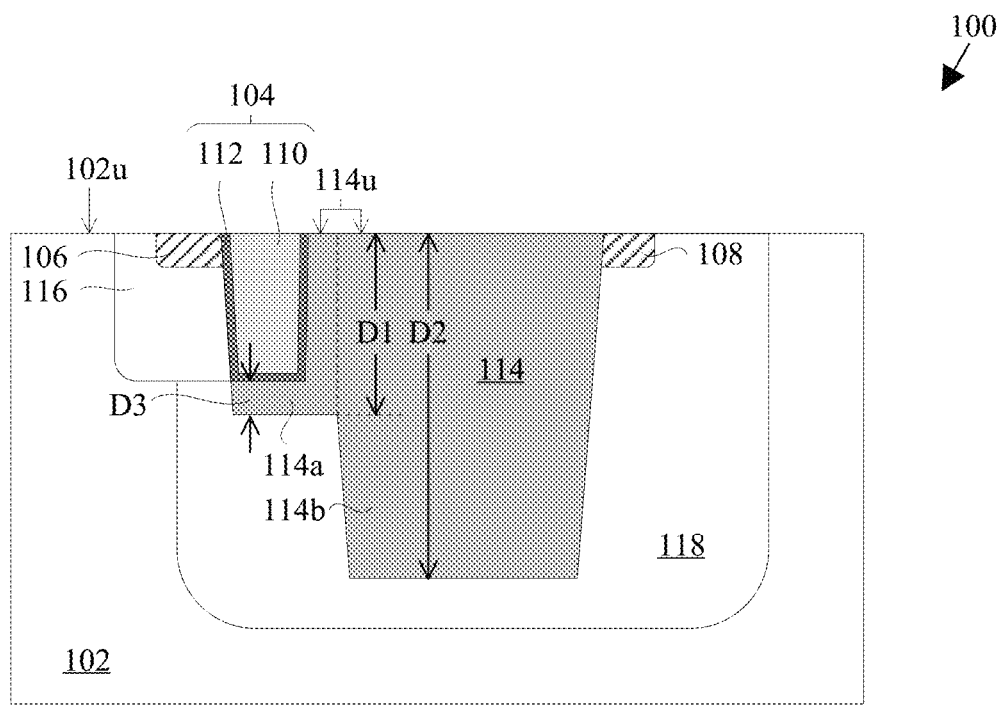

FIG. 2F illustrates the FET 100 after forming a source region 106 and a drain region 108, according to an embodiment of the disclosure. The source region 106 and drain regions 108 may be formed at laterally opposite sides of the trench isolation structure 114. The source region 106 may be positioned nearer to the gate structure 104 than to the drain region 108, thereby resulting in the FET 100 being an asymmetrical FET.

The source region 106 and drain region 108 may be formed using various doping techniques. The source region 106 and drain region 108 may be formed by doping the substrate 102 with dopants having a given conductivity type (e.g., N-type conductivity). The source region 106 and drain region 108 may be formed concurrently or sequentially.

The FET 100 may further include a plurality of doped wells, such as a doped well 116 and a doped well 118. Similar to the source region 106 and drain region 108, the doped wells 116, 118 may be formed by introducing dopants into the substrate 102. In an embodiment of the disclosure, the doped well 116 may have a different conductivity as the source region 106. In another embodiment of the disclosure, the doped well 118 may have the same conductivity as the drain region 108. The dopants in the doped well 118 may or may not include the same dopants as the drain region 108.

As presented in the above disclosure, FETs of semiconductor devices having a gate structure in a dual-depth trench isolation structure and methods of forming the same are presented. The FET may be formed in a substrate and may include a substantially vertical gate structure and the trench isolation structure extending downwardly below from an upper surface of the substrate. The FET may include a substantially vertical channel region that may be substantially parallel to a gate dielectric layer of the gate structure.

The FET with a substantially vertical gate structure advantageously improves a figure-of-merit of the asymmetrical FET. For example, by forming a vertical gate structure adjacent to the trench isolation structure, electrical charges may be made to flow around the gate structure and the trench isolation structure, thereby enabling a reduction of cell pitch while improving the breakdown voltage of the FET. Having reduced cell pitch further improves the on-resistance of the FET. For example, by reducing one or more of the cell pitch or the device pitch, or increasing the linear current.

The terms "upper", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A device, comprising:
   a substrate having an upper surface;
   a source region in the substrate;
   a drain region in the substrate;
   a trench isolation structure in the substrate between the source region and the drain region, the trench isolation structure having a first portion with a first lower surface and a second portion with a second lower surface below the first lower surface of the first portion, the second portion is connected to the first portion and in contact with the drain region, wherein the first portion and the second portion of the trench isolation structure comprise the same dielectric material; and
   a gate structure in the substrate adjacent to the trench isolation structure.

2. The device of claim 1, wherein the gate structure is positioned adjacent to the first portion of the trench isolation structure.

3. The device of claim 2, wherein the first portion of the trench isolation structure includes a first section underlying and between the gate structure and the first lower surface of the first portion of the trench isolation structure.

4. The device of claim 3, wherein the first portion of the trench isolation structure includes a second section laterally between the gate structure and the second portion of the trench isolation structure.

5. The device of claim 2, wherein the first portion of the trench isolation structure includes a first section and a second section adjacent to the first section, and the gate structure extends from the upper surface of the substrate to the first section of the first portion of the trench isolation structure.

6. The device of claim 5, wherein the second section of the first portion of the trench isolation structure extends from the upper surface of the substrate to the first section of the first portion of the trench isolation structure.

7. The device of claim 1, wherein the gate structure further comprises a gate electrode and a dielectric layer positioned adjacent to the gate electrode.

8. The device of claim 7, wherein the dielectric layer has a side surface, and the first portion of the trench isolation structure has a side surface that is substantially coplanar with the side surface of the dielectric layer.

9. The device of claim 1, wherein the gate structure is between and in contact with the source region and the first portion of the trench isolation structure.

10. The device of claim 9, further comprising:
    a first doped well in the substrate and positioned adjacent to the gate structure, wherein the source region is in the first doped well; and
    a second doped well in the substrate and positioned adjacent to the gate structure, wherein the drain region and the trench isolation structure are in the second doped well.

11. The device of claim 1, wherein the first portion of the trench isolation structure has a first upper surface and the second portion of the trench isolation structure has a second upper surface, and the first upper surface of the first portion of the trench isolation structure and the second upper surface of the second portion of the trench isolation structure are substantially coplanar with the upper surface of the substrate.

12. The device of claim 1, wherein the gate structure has an upper surface, and the upper surface of the gate structure is substantially coplanar with the upper surface of the substrate.

13. A method of forming a device, comprising:
    forming a first trench in a substrate having a lower surface;
    forming a second trench in the substrate adjacent to and connected to the first trench, wherein the second trench has a greater depth than the first trench, relative to an upper surface of the substrate;
    filling the first trench and the second trench with a dielectric material to a level substantially coplanar with an upper surface of the substrate before forming a gate structure, wherein the first trench and the second trench form a first portion and a second portion of a trench isolation structure, respectively, wherein a lower surface of the first portion is above a lower surface of the second portion;
    forming the gate structure in the substrate adjacent to the trench isolation structure; and
    forming a source region and a drain region in the substrate at opposite sides of the trench isolation structure, wherein the drain region is in contact with the second portion of the trench isolation structure.

14. The method of claim 13, wherein forming the gate structure comprises:
    forming a gate trench in the first portion of the trench isolation structure, wherein the gate trench has a substrate surface;
    lining a dielectric layer over the substrate surface; and
    filling the gate trench with a conductive material to form a gate electrode, wherein the dielectric layer and the gate electrode form the gate structure and have substantially coplanar upper surfaces.

15. The device of claim 1, wherein the first and second portions of the trench isolation structure comprise a first upper surface and second upper surface, respectively, and the first upper surface is substantially coplanar with the second upper surface.

16. The device of claim 1, wherein the first portion of the trench isolation structure comprises a side surface and the gate structure comprises a side surface, and the side surface of the gate structure is substantially coplanar with the side surface of the first portion of the trench isolation structure.

17. The device of claim 1, wherein the first portion of the trench isolation structure has a first depth relative to the upper surface of the substrate and the second portion of the trench isolation structure has a second depth relative to the upper surface of the substrate, the first depth is shallower than the second depth, and the first depth of the first portion of the trench isolation structure is at most half that of the second depth of the second portion of the trench isolation structure.

18. The device of claim 1, further comprising:
    a first doped well in the substrate and positioned adjacent to the gate structure, wherein the source region is positioned in the first doped well; and
    a second doped well in the substrate and positioned adjacent to the gate structure, wherein the drain region is adjacent to the second portion of the trench isolation structure, and the drain region and the trench isolation structure are positioned in the second doped well.

* * * * *